(12) United States Patent
Lin

(10) Patent No.: US 11,315,865 B2
(45) Date of Patent: Apr. 26, 2022

(54) CIRCUIT BOARD STRUCTURE AND MANUFACTURING METHOD THEREOF

(71) Applicant: Unimicron Technology Corp., Taoyuan (TW)

(72) Inventor: Chien-Chen Lin, Taoyuan (TW)

(73) Assignee: Unimicron Technology Corp., Taoyuan (TW)

(*) Notice: Subject to any disclaimer, the term of this patent is extended or adjusted under 35 U.S.C. 154(b) by 0 days.

(21) Appl. No.: 17/234,826

(22) Filed: Apr. 20, 2021

(65) Prior Publication Data
US 2021/0242123 A1      Aug. 5, 2021

Related U.S. Application Data

(62) Division of application No. 16/579,812, filed on Sep. 23, 2019, now Pat. No. 11,011,458.

(30) Foreign Application Priority Data

Jul. 18, 2019   (TW) .................................. 108125490

(51) Int. Cl.
| H05K 3/06 | (2006.01) |
| H01L 23/498 | (2006.01) |
| H01L 21/48 | (2006.01) |
| H05K 1/11 | (2006.01) |

(52) U.S. Cl.
CPC .... H01L 23/49838 (2013.01); H01L 21/4857 (2013.01); H01L 23/49822 (2013.01); H05K 1/11 (2013.01); H05K 3/06 (2013.01)

(58) Field of Classification Search
CPC ............................................. H05K 3/06–3/07
See application file for complete search history.

(56) References Cited

U.S. PATENT DOCUMENTS

| 5,246,817 A | 9/1993 | Shipley, Jr. |
| 10,602,621 B1 | 3/2020 | Hu |
| 2017/0338174 A1 | 11/2017 | Hu et al. |

FOREIGN PATENT DOCUMENTS

| CN | 101902884 A | 12/2010 |
| CN | 107872929 A | 4/2018 |
| CN | 108738231 A | 11/2018 |
| CN | 109725500 A | 5/2019 |
| JP | 2019062113 A | 4/2019 |
| TW | 466895 B | 12/2001 |
| TW | 502392 B | 9/2002 |
| TW | I393233 B | 4/2013 |
| TW | I556382 B | 11/2016 |

*Primary Examiner* — Jeremy C Norris
(74) *Attorney, Agent, or Firm* — CKC & Partners Co., LLC

(57) ABSTRACT

A method of manufacturing circuit board structure includes forming a sacrificial layer having first openings on a substrate; forming a metal layer on the sacrificial layer; forming a patterned photoresist layer having second openings over the sacrificial layer, in which the second openings are connected to the first openings and expose a portion of the metal layer; forming a first circuit layer filling the second openings and the first openings; forming a first dielectric layer over the sacrificial layer and covering the metal layer, in which the first dielectric layer has third openings exposing the first circuit layer; forming a second circuit layer filling the third openings and covering a portion of the first dielectric layer; removing the substrate to expose the sacrificial layer, a portion of the metal layer and a portion of the first circuit layer; and removing the sacrificial layer and the metal layer.

8 Claims, 10 Drawing Sheets

CIRCUIT BOARD STRUCTURE AND MANUFACTURING METHOD THEREOF

CROSS-REFERENCE TO RELATED APPLICATION

This application is a Divisional Application of the U.S. application Ser. No. 16/579,812, filed Sep. 23, 2019, which claims priority to Taiwan Application Serial Number 108125490, filed Jul. 18, 2019, all of which are herein incorporated by reference.

BACKGROUND

Field of Invention

The present disclosure relates to a circuit board structure and a manufacturing method thereof. More particularly, the present disclosure relates to a method of manufacturing a circuit board structure without an additional step of forming a conductive bump.

Description of Related Art

The conventional method of manufacturing a circuit board includes a step of forming a conductive bump on a die side of a circuit board. The step includes providing a mask having an opening, and then forming a material of the conductive bump in the opening of the mask, followed by removing the mask to obtain the conductive bump. However, an annular ring is likely to occur at the periphery of the conductive bump formed by the above method, thereby reducing the ratio of area utilization on the die side of the circuit board. Furthermore, in the conventional method, since the conductive bump and the underlying circuit layer in direct contact therewith are formed by different processes, there is an interface between them. Accordingly, a novel method of manufacturing circuit board is needed to address these issues.

SUMMARY

One aspect of the present disclosure is to provide a method of manufacturing circuit board structure. The method comprises the following step: forming a sacrificial layer on a substrate, in which the sacrificial layer has a first opening exposing a portion of the substrate; forming a metal layer on a sidewall and a top surface of the sacrificial layer; forming a patterned photoresist layer over the sacrificial layer, in which the patterned photoresist layer has a second opening connecting to the first opening and exposing a portion of the metal layer; forming a first circuit layer filling the second opening and the first opening, in which the first circuit layer covers the portion of the metal layer; forming a first dielectric layer over the sacrificial layer and covering the metal layer, in which the first dielectric layer has a third opening exposing the first circuit layer; forming a second circuit layer filling the third opening and covering a portion of the first dielectric layer; removing the substrate to expose the sacrificial layer, a portion of the metal layer, and a portion of the first circuit layer; and removing the sacrificial layer and the metal layer.

In one embodiment of the present disclosure, the first circuit layer has a first portion located in the first opening and a second portion located in the second opening, in which the first portion and the second portion are integrally formed.

In one embodiment of the present disclosure, the step of forming the metal layer on the sacrificial layer comprises conformally forming the metal layer on the sacrificial layer.

In one embodiment of the present disclosure, the step of forming the patterned photoresist layer over the sacrificial layer comprises forming a photoresist layer over the sacrificial layer; exposing the photoresist layer by using a first light source, in which the first light source and the sacrificial layer are respectively disposed on opposite sides of the substrate; exposing the photoresist layer by using a second light source, in which the second light source is disposed at the side of the substrate on which the sacrificial layer is disposed; and performing a developing step to form the patterned photoresist layer.

In one embodiment of the present disclosure, the photoresist layer comprises a positive photoresist material.

In one embodiment of the present disclosure, the substrate is made of a light transmissive material.

In one embodiment of the present disclosure, after the step of forming the second circuit layer and before the step of removing the substrate, the method further comprises forming a second dielectric layer over the first dielectric layer and covering the first dielectric layer and the second circuit layer, in which the second dielectric layer has a fourth opening exposing the second circuit layer; and forming a third circuit layer filling the fourth opening and covering a portion of the second dielectric layer.

In one embodiment of the present disclosure, after the step of forming the second circuit layer and before the step of removing the substrate, the method further comprises forming a solder mask layer on the first dielectric layer.

Another aspect of the present disclosure is to provide a circuit board structure. The circuit board structure comprises at least one dielectric layer, a first circuit layer, and a second circuit layer. The first circuit layer has a first portion and a second portion. The first portion protrudes from a top surface of the dielectric layer, and the second portion is embedded in the dielectric layer and exposed from the top surface. The first portion and the second portion are integrally formed without an interface therebetween. The second circuit layer is disposed over the dielectric layer and electrically connecting to the first circuit layer.

In one embodiment of the present disclosure, the at least one dielectric layer comprises a plurality of dielectric layers.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
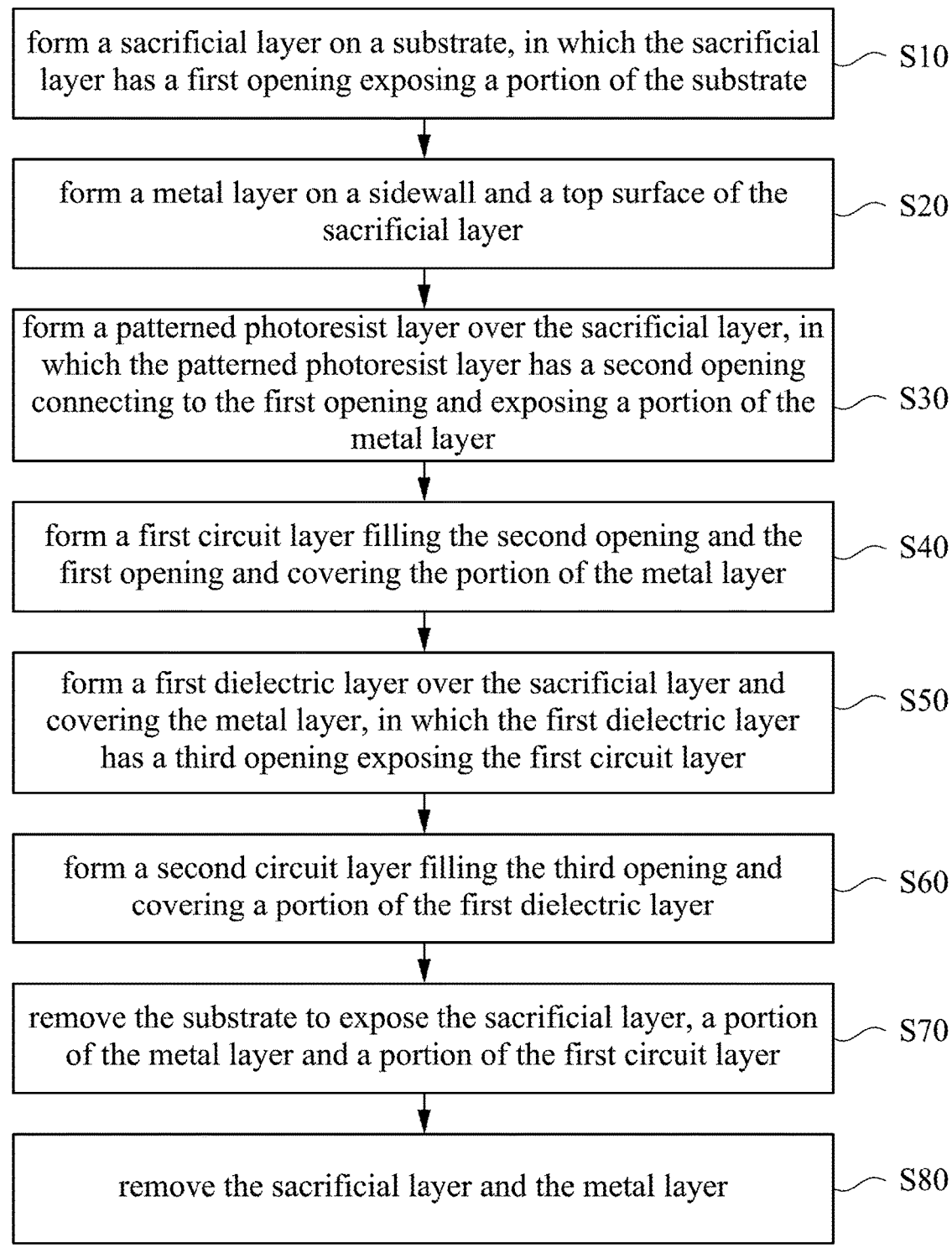
FIG. 1 illustrates a flow chart of a method of manufacturing circuit board structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. The embodiments disclosed below may be combined or substituted with each other in an advantageous situation, and other embodiments may be added to an embodiment without further description or explanation.

In the following description, numerous specific details are set forth in the following detailed description. However, embodiments of the present disclosure may be practiced without such specific details. In order to simplify the drawings, well-known structures and devices are only schematically shown in the figure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One aspect of the present disclosure is to provide a method of manufacturing a circuit board structure. The method avoids the occurrence of an annular ring at the periphery of a conductive bump on a die side of the circuit board structure, thereby increasing the ratio of area utilization on the die side of the circuit board. Furthermore, in the present method, the conductive bump and the circuit layer in direct contact therewith are integrally formed, i.e., there is no interface between them. FIG. 1 illustrates a flow chart of a method of manufacturing circuit board structure according to one embodiment of the present disclosure. FIGS. 2 to 17 depict schematic cross-sectional views of various process stages in the manufacturing method according to one embodiment of the present disclosure. As shown in FIG. 1, the method 10 comprises step S10 to step S80.

Figure 2:
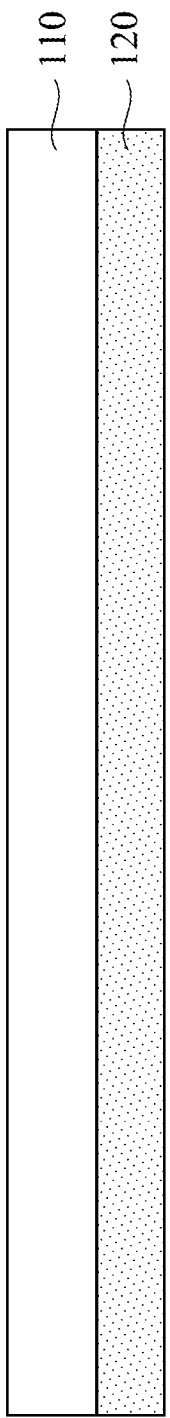
FIGS. 2 to 17 depict schematic cross-sectional views of various process stages in the manufacturing method according to one embodiment of the present disclosure.
Figure 3:
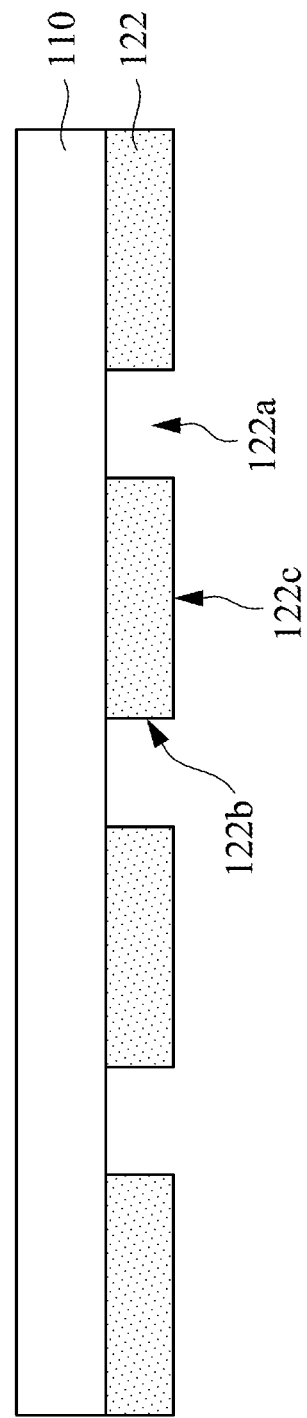

At step S10, a sacrificial layer is formed on the substrate. FIGS. 2 to 3 illustrate the details of implementing step S10 according to one embodiment of the present disclosure. First, referring to FIG. 2, a sacrificial material layer 120 is formed on a substrate 110. In one embodiment, the substrate 110 is made of a light transmissive material, such as glass or other suitable material. In one embodiment, the sacrificial material layer 120 includes, but not limited to, phenolic resin, epoxy resin, polyimide resin, or polytetrafluoroethylene. In one embodiment, the sacrificial material layer 120 is formed by, for example, a lamination process, a coating process, or any other suitable process. Next, referring to FIG. 3, a plurality of first openings 122a are formed in the sacrificial material layer 120, such that a sacrificial layer 122 is obtained. In some embodiments, the first openings 122a are formed by, but not limited to, a laser ablation process or a conventional lithography process. A portion of the substrate 110 is exposed from the first openings 122a. The sacrificial layer 122 has sidewalls 122b and a top surface 122c.

Figure 4:
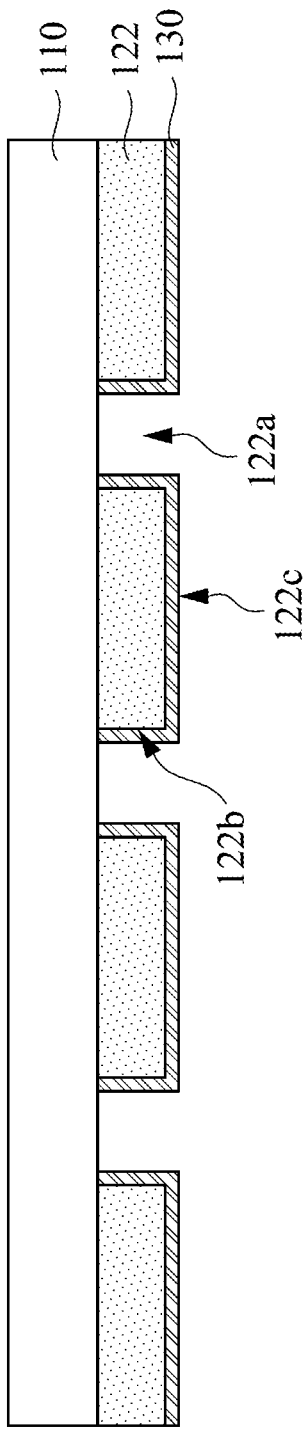

At step S20, a metal layer is formed on the sidewalls and the top surface of the sacrificial layer. Reference is made to FIG. 4. In some embodiments, a metal layer 130 is conformally formed on the sidewalls 122b and the top surface 122c of the sacrificial layer 122. In some embodiments, the metal layer 130 includes copper and may be formed by an electroless deposition process, but the present disclosure is not limited thereto.

Figure 5:
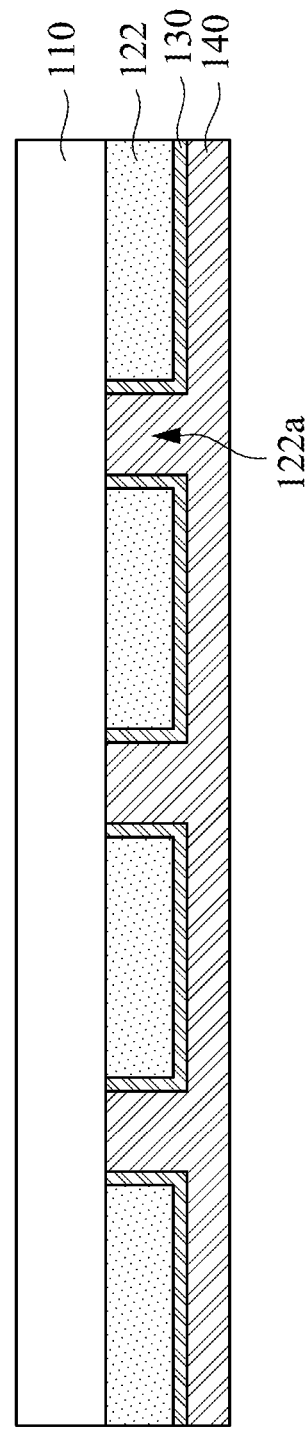

At step S30, a patterned photoresist layer is formed over the sacrificial layer. FIGS. 5 to 8 depict the details of implementing step S30 according to one embodiment of the present disclosure. Reference is made to FIG. 5. A photoresist layer 140 is formed over the sacrificial layer 122. The photoresist layer 140 is filled in the first openings 122a of the sacrificial layer 122 and completely covers the metal layer 130. In one embodiment, the photoresist layer 140 comprises a positive-tone photoresist material.

Figure 6:
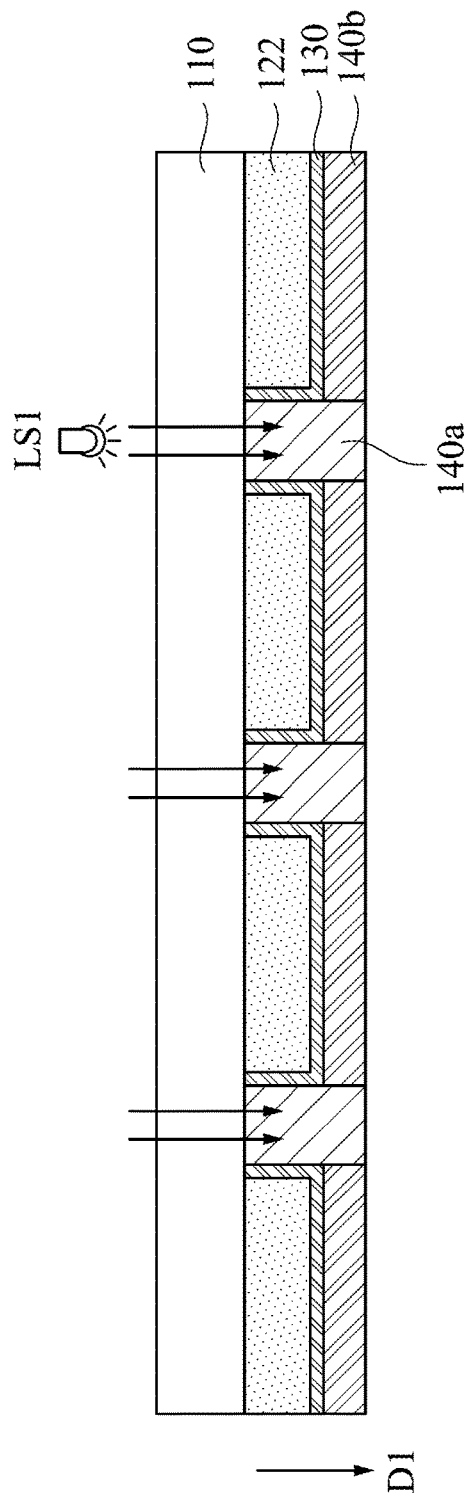

Next, referring to FIG. 6, the photoresist layer 140 is exposed by using a first light source "LS1", and the sacrificial layer 122 (or the metal layer 130) serves as a first mask, such that a first exposed region 140a and a first unexposed region 140b are formed in the photoresist layer 140. It is noted that the first light source "LS1" is disposed at the other side (i.e., opposite to the sacrificial layer 122) of the substrate 110, and the light emitted by the first light source "LS1" travels along a first direction D1. In other words, the light emitted by the first light source "LS1" transmits through the substrate 110 and the first openings 122a along the first direction D1. Therefore, portions of the photoresist layer 140 (or the metal layer 130) that are not shielded by the sacrificial layer 122 may receive the light emitted from the first light source "LS1", resulting in the formation of the first exposed region 140a. Furthermore, portions of the photoresist layer 140 that are shielded by the sacrificial layer 122 (or the metal layer 130) may not receive the light emitted from the first light source "LS1", resulting in the formation of the first unexposed region 140b.

Figure 7:
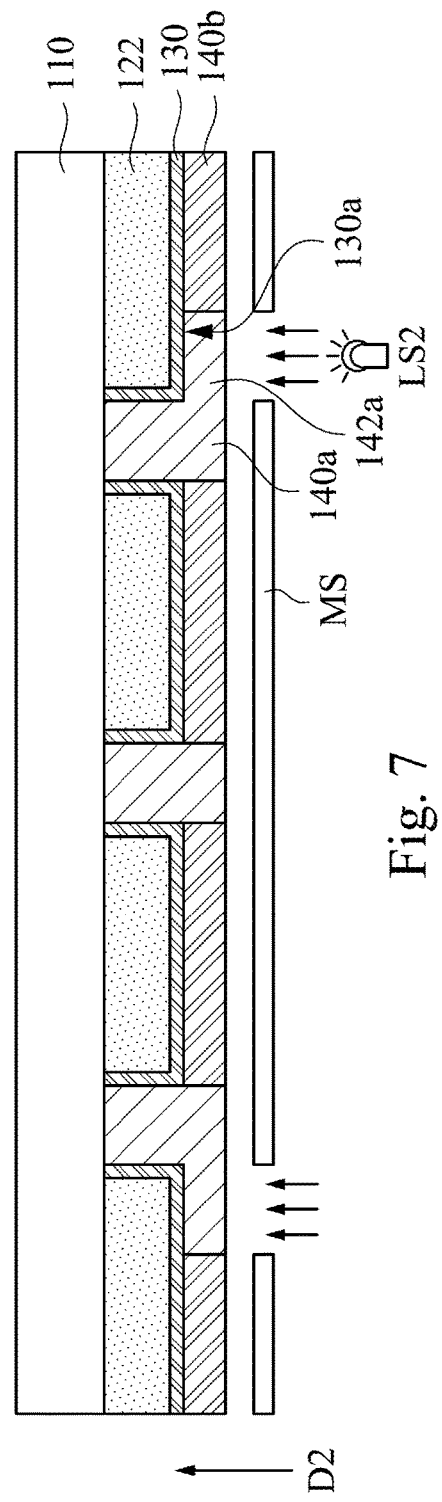

Next, referring to FIG. 7, a second mask "MS" is disposed at the side of the substrate 110 on which the sacrificial layer 122 is disposed. A portion of the first unexposed region 140b is exposed by using a second light source "LS2", resulting in the formation of a second exposed region 142a in the first unexposed region 140b. It is noted that the second light source "LS2" is disposed at the side of the substrate 110 on which the sacrificial layer 122 is disposed, and the light emitted by the second light source "LS2" travels along a second direction D2 that is opposite to the first direction D1. In other words, the first light source "LS1" and the second light source "LS2" are respectively disposed at opposite sides of the substrate 110, and the light emitted by the second light source "LS2" does not transmit the substrate 110.

Figure 8:
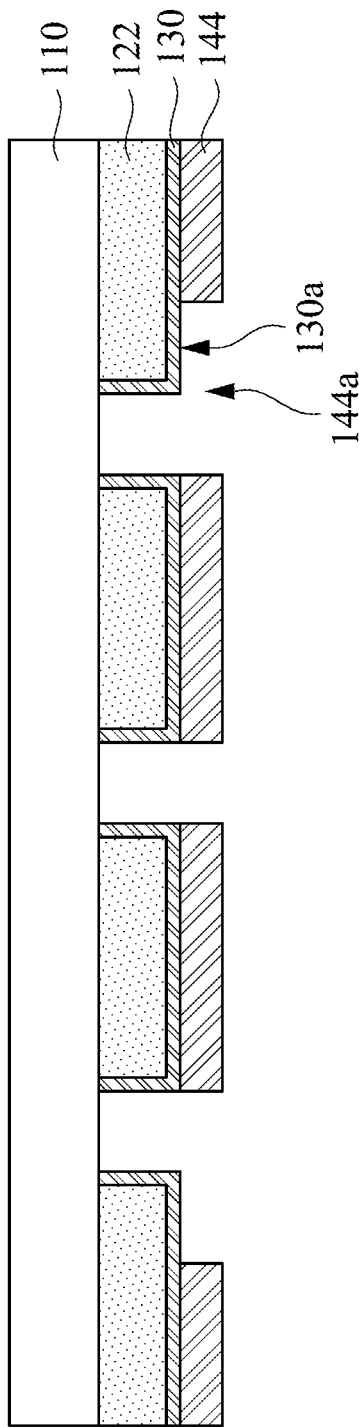

Next, referring to FIG. 8, a developing step is performed to remove the first exposed region 140a and the second exposed region 142a, thereby forming a patterned photoresist layer 144. In other words, after the developing step is performed, the first exposed region 140a and the second exposed region 142a are simultaneously removed, and the remaining portion of the photoresist layer is referred to as the patterned photoresist layer 144. It is noted that the patterned photoresist layer 144 has a plurality of the second openings 144a connecting to the first openings 122a. In addition, a portion of the substrate 110 and a portion 130a of the metal layer 130 are exposed from the second openings 144a.

Figure 9:
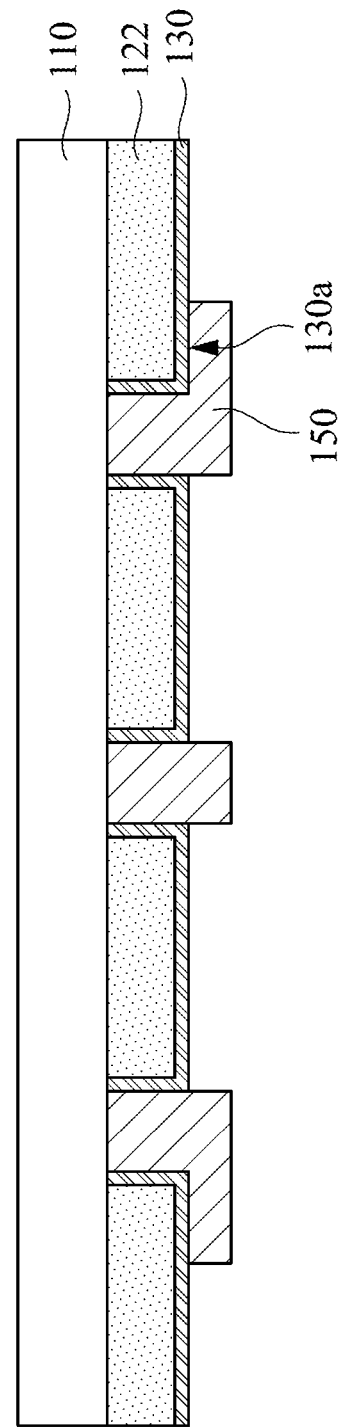

At step S40, a first circuit layer is formed filling the second opening and covering the exposed portion of the metal layer. Referring to FIG. 9, a first circuit layer 150 is formed and filling in the second openings 144a. The first circuit layer 150 covers the exposed portion of the substrate and the portion 130a that is exposed from the patterned photoresist layer 144. The first circuit layer 150 may include any conductive material, such as copper, nickel, silver, or the like. The first circuit layer 150 may be formed by an electroplating process, but is not limited thereto. As shown in FIG. 9, the first circuit layer 150 is embedded in the metal layer 130, and the upper surface of the first circuit layer 150 protrudes beyond the upper surface of the metal layer 130.

Figure 10:
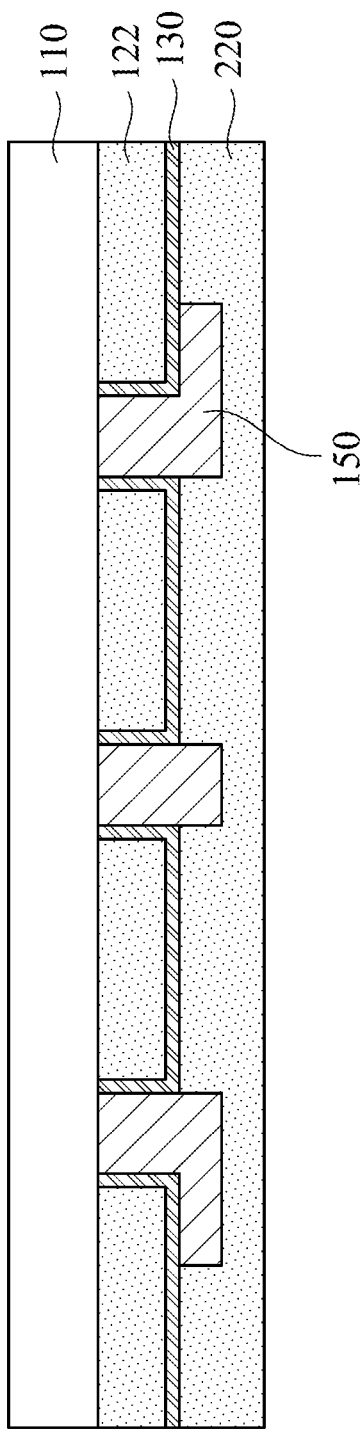
Figure 11:
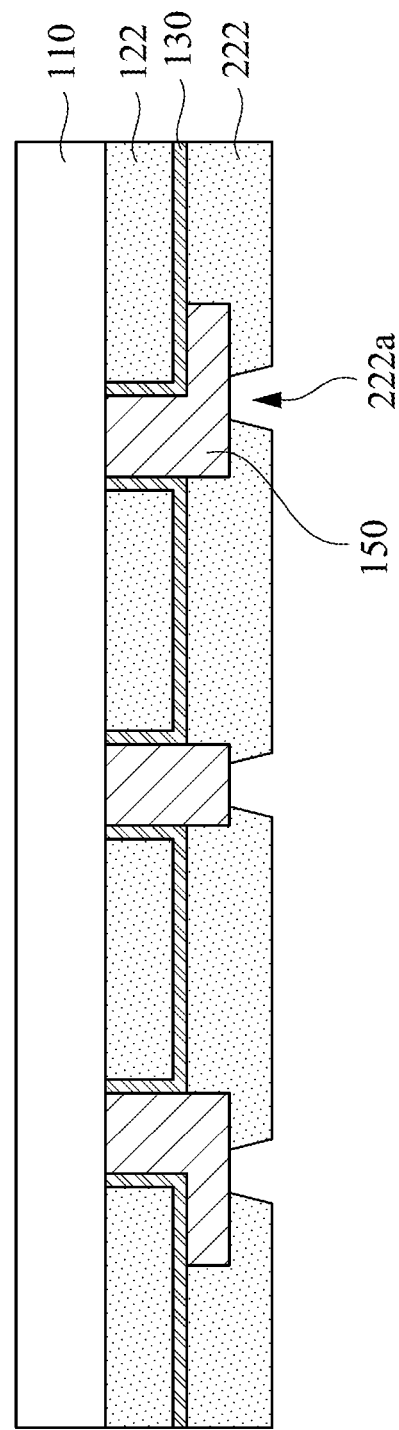

At step S50, a first dielectric layer is formed over the sacrificial layer and covers the metal layer. FIGS. 10 to 11 depict the details of implementing step S50 according to one embodiment of the present disclosure. First, referring to FIG. 10, a second precursor dielectric layer 220 is formed over the sacrificial layer 122 and covers the metal layer 130 as well as the first circuit layer 150. The forming process and material of the second precursor dielectric layer 220 are similar to those of the sacrificial material layer 120, and therefore are not repeated herein. Next, referring to FIG. 11, a plurality of the third openings 222a are formed in the second precursor dielectric layer 220, such that a first dielectric layer 222 is obtained. The first circuit layer 150 is exposed from the third openings 222a. The forming process of the third openings 222a is similar to that of the first openings 122a, and therefore is not repeated herein.

Figure 12:
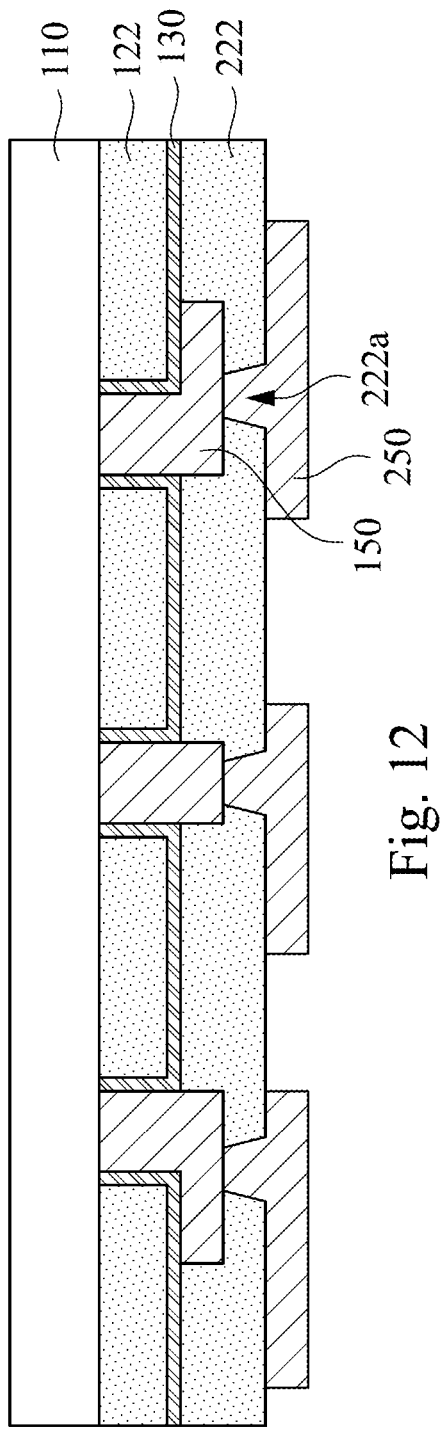
Figure 13:
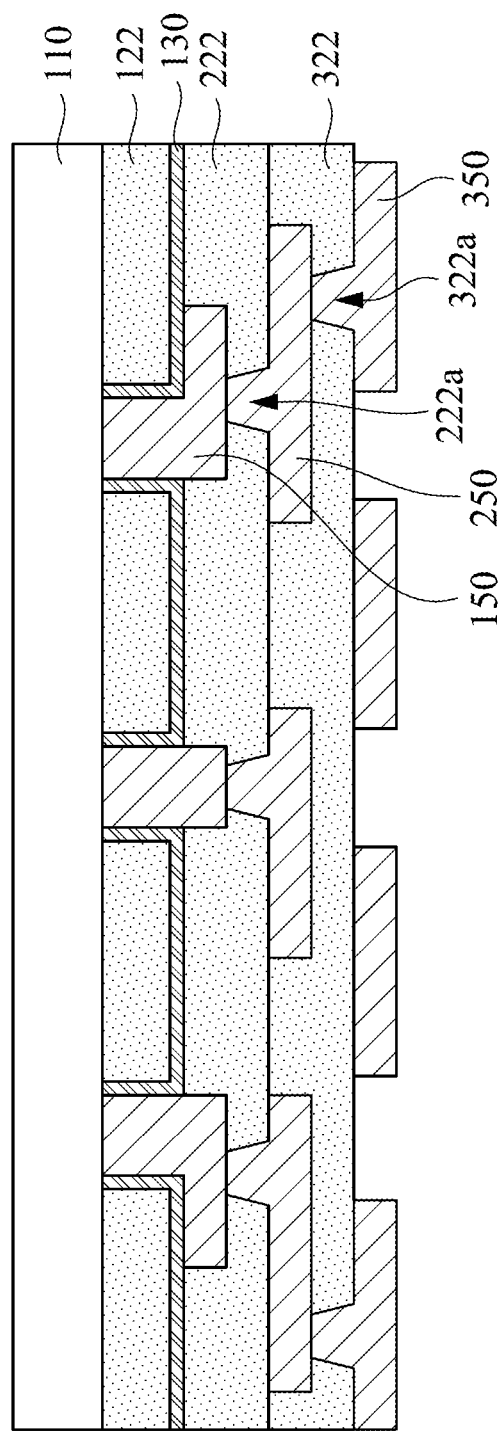

At step S60, a second circuit layer is formed filling the second opening and covers a portion of the first dielectric layer. Referring to FIG. 12, a second circuit layer 250 is formed filling the third openings 222a and covers a portion of the first dielectric layer 222. The forming process and material of the second circuit layer 250 are similar to those of the first circuit layer 150, and therefore are not repeated herein.

It is understood that the number of dielectric layers and the number of circuit layers shown in FIG. 12 are only illustrative, and those skilled in the art can appropriately select the desired number of dielectric layers and circuit layers. For example, referring to FIG. 13, in some other embodiments of the present disclosure, after the formation of the second circuit layer 250, the method 10 further includes forming a second dielectric layer 322 over the first dielectric layer 222. The second dielectric layer 322 is disposed on the first dielectric layer 222 as well as the second circuit layer 250, and has a plurality of the fourth openings 322a. Still referring to FIG. 13, in some other embodiments of the present disclosure, after the formation of the second dielectric layer 322, the method 10 further includes forming a third circuit layer 350 filling in the fourth openings 322a, and a portion of the second dielectric layer 322 is covered by the third circuit layer 350. The forming process and material of the second dielectric layer 322 and the third circuit layer 350 are similar to those of the first dielectric layer 222 and the second circuit layer 250, respectively, and therefore are not repeated herein.

Figure 14:
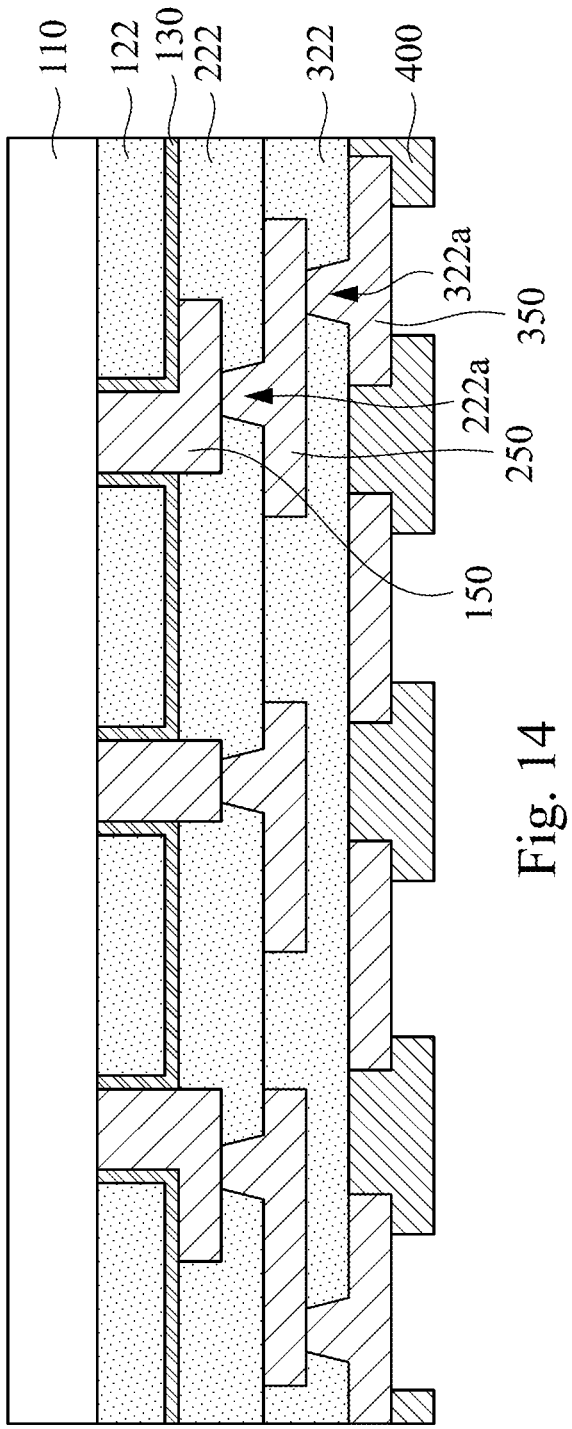

Referring to FIG. 14, in one embodiment of the present disclosure, as the desired number of dielectric layers and circuit layers is satisfied, the method 10 further includes forming a solder mask layer 400 on the outermost dielectric layer. For example, as shown in FIG. 14, the solder mask layer 400 may be formed on the second dielectric layer 322. The solder mask layer 400 may be formed by, for example, a lamination process, a screen printing process, a coating process, or the like.

Figure 15:
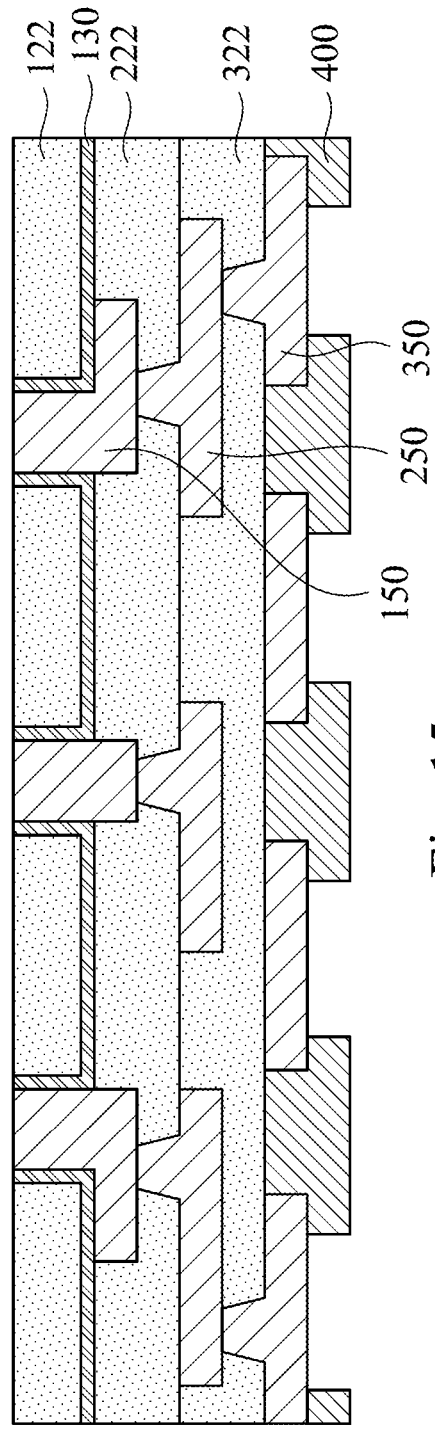
Figure 16:
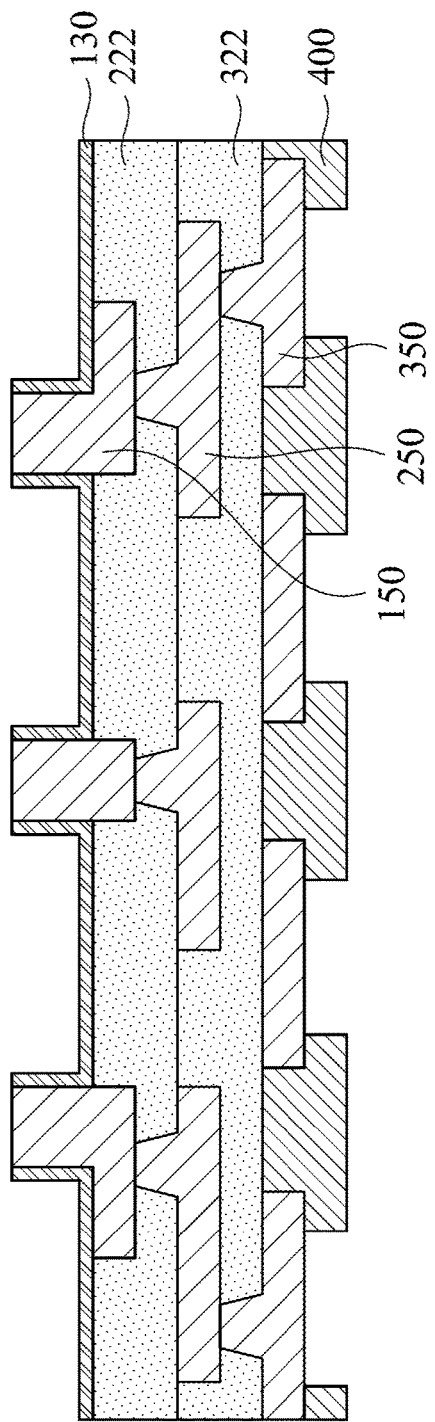

Next, at step S70, the substrate is removed, such that the sacrificial layer, a portion of the metal layer, and a portion of the first circuit layer are exposed. As shown in FIG. 15, the substrate 110 is removed, such that the sacrificial layer 122, a portion of the metal layer 130, and a portion of the first circuit layer 150 are exposed. Next, at step S80, the sacrificial layer and the metal layer are sequentially removed, such that the entire first circuit layer is exposed. As shown in FIG. 16, in one embodiment of the present disclosure, the sacrificial layer 122 is first removed, such that the entire the metal layer 130 is exposed. Subsequently, as shown in FIG. 17, the metal layer 130 is then removed, such that the portion of the first circuit layer 150 that is originally covered by the metal layer 130 is exposed.

It is noted that compared with the conventional method, in which the conductive bump and the underlying circuit layer in direct contact therewith are respectively formed by different processes, the method of manufacturing circuit board structure as provided in the present disclosure is capable to simultaneously form the first circuit layer 150 and the conductive bump 160. In detail, the first circuit layer 150 has a first portion 150a and a second portion 150b, in which the first portion 150a protrudes from the first dielectric layer 222 and serves as a conductive bump 160. Accordingly, in the circuit board structure formed by the present method, there is no annular ring at the periphery of the conductive bump 160, thereby increasing the ratio of area utilization on the die side of the circuit board. In addition, compared with the conventional manufacturing method, the method of the present disclosure does not require any additional steps of forming a conductive bump, thereby reducing the process time and costs. Furthermore, the conductive bump 160 and the second portion 150b in direct contact therewith are integrally formed in the present method. In other words, there is no interface between the conductive bump 160 and the second portion 150b.

Another aspect of the present disclosure provides a circuit board structure. Referring to FIG. 17, in one embodiment of the present disclosure, a circuit board structure 100 comprises a first dielectric layer 222, a second dielectric layer 322, a first circuit layer 150, a second circuit layer 250, a third circuit layer 350, and a solder mask layer 400. It is noted that the first circuit layer 150 has a first portion 150a and a second portion 150b. The first portion 150a protrudes from a top surface 222b of the first dielectric layer 222. The second portion 150b is embedded in the first dielectric layer 222 and exposed from the top surface 222b. The first portion 150a and the second portion 150b are integrally formed, and there is no interface between the first portion 150a and the second portion 150b. The second circuit layer 250 is located on the first dielectric layer 222 and embedded in the second dielectric layer 322. The third circuit layer 350 is located on the second dielectric layer 322 and covers a portion of the second dielectric layer 322. The solder mask layer 400 partially covers the third circuit layer 350. The solder mask layer 400 has an opening that exposes a portion of the third circuit layer 350. The first circuit layer 150, the second circuit layer 250, and the third circuit layer 350 are mutually electrically connected. It is understood that the number of dielectric layers and the number of circuit layers illustrated in FIG. 17 are merely illustrative and are not intended to limit the present disclosure.

Figure 17:
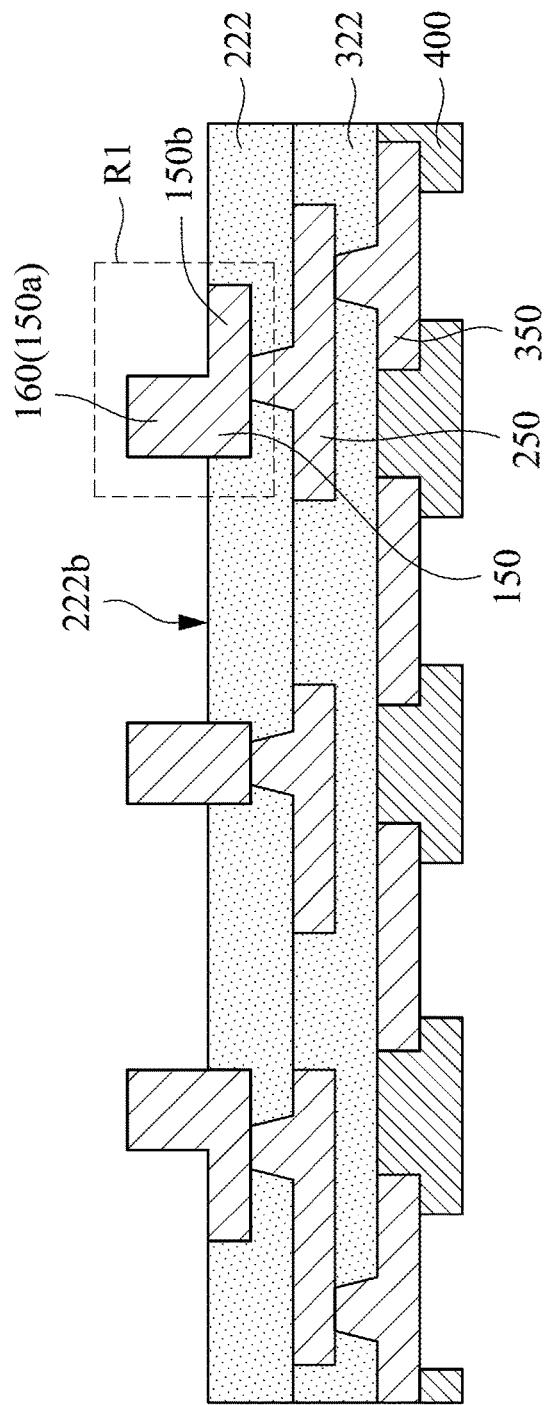
Figure 19:
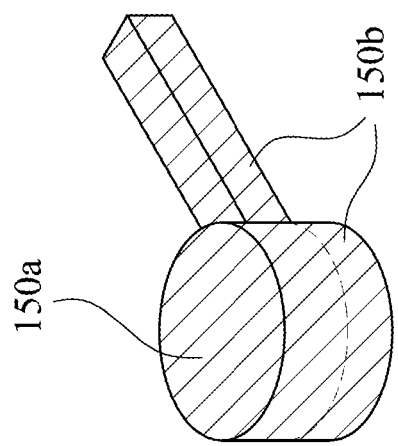
FIG. 19 depicts a perspective view of a first circuit layer 150 in the region "R1" of FIG. 18.
Figure 18:
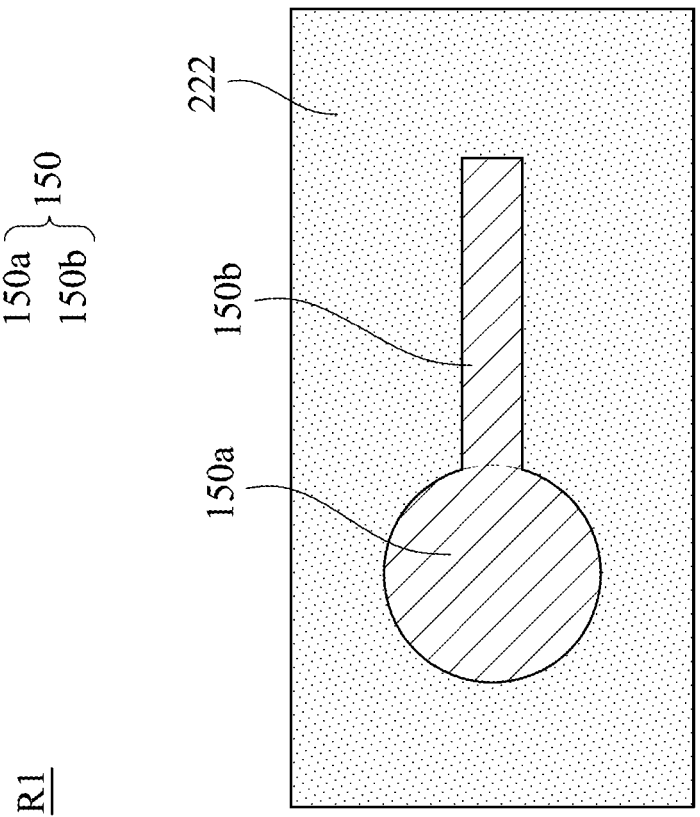
FIG. 18 depicts a top view of a region "R1" in FIG. 17.

It is noted that the first portion 150a and the second portion 150b of the first circuit layer 150 shown in FIG. 17 are integrally formed. Reference is made to FIG. 18 and FIG. 19. FIG. 18 depicts a top view of a region "R1" in FIG. 17. FIG. 19 depicts a perspective view of the first circuit layer 150 in the region "R1" of FIG. 18. Specifically, in FIG. 18 and FIG. 19, the first circuit layer 150 comprises the first portion 150a and the second portion 150b. The first portion 150a protrudes beyond the first dielectric layer 222. The second portion 150b is embedded in the first dielectric layer 222. The first portion 150a and the second portion 150b are integrally formed. In other words, the circuit board structure of the present disclosure is different from the conventional circuit board, as there is no interface or any rough contact surface between the first portion 150a and second portion 150b in the circuit board structure of the present disclosure.

In summary, the present disclosure provides a circuit board structure and a method of manufacturing the same. Compared with the conventional method of manufacturing circuit board structure, the manufacturing method of the present disclosure does not require any additional steps of forming a conductive bump, thereby reducing the process time and costs. Moreover, in the circuit board structure manufactured by the method of the present disclosure, there is no annular ring at the periphery of the conductive bump, thereby increasing the ratio of area utilization on the die side of the circuit board. Furthermore, in the circuit board structure manufactured by the method of the present disclosure, the conductive bump and the circuit layer in direct contact therewith are integrally formed. In other words, there is no interface between the conductive bump and the circuit layer in direct contact therewith.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a circuit board structure, comprising steps of:
    forming a sacrificial layer on a substrate, wherein the sacrificial layer has a first opening exposing a portion of the substrate;
    forming a metal layer on a sidewall and a top surface of the sacrificial layer;
    forming a patterned photoresist layer over the sacrificial layer, wherein the patterned photoresist layer has a second opening connecting to the first opening and exposing a portion of the metal layer;
    forming a first circuit layer filling the second opening and the first opening, wherein the first circuit layer covers the portion of the metal layer;
    forming a first dielectric layer over the sacrificial layer and covering the metal layer, wherein the first dielectric layer has a third opening exposing the first circuit layer;
    forming a second circuit layer filling the third opening and covering a portion of the first dielectric layer, wherein the second circuit layer is integrally formed without any interface;
    removing the substrate to expose the sacrificial layer, a portion of the metal layer, and a portion of the first circuit layer; and
    removing the sacrificial layer and the metal layer.

2. The method of claim 1, wherein the first circuit layer has a first portion located in the first opening and a second portion located in the second opening, while the first portion and the second portion are integrally formed as a unitary structure.

3. The method of claim 1, wherein the step of forming the metal layer on the sacrificial layer comprises conformally forming the metal layer on the sacrificial layer.

4. The method of claim 1, wherein the step of forming the patterned photoresist layer over the sacrificial layer comprises:
    forming a photoresist layer over the sacrificial layer;
    exposing the photoresist layer by using a first light source, wherein the first light source and the sacrificial layer are respectively disposed on opposite sides of the substrate;
    exposing the photoresist layer by using a second light source, wherein the second light source is disposed at a side of the substrate on which the sacrificial layer is disposed; and
    performing a developing step to form the patterned photoresist layer.

5. The method of claim 4, wherein the photoresist layer comprises a positive photoresist material.

6. The method of claim 1, wherein the substrate is made of a light transmissive material.

7. The method of claim 1, after the step of forming the second circuit layer and before the step of removing the substrate, further comprising:
    forming a second dielectric layer over the first dielectric layer and covering the first dielectric layer and the second circuit layer, wherein the second dielectric layer has a fourth opening exposing the second circuit layer; and
    forming a third circuit layer filling the fourth opening and covering a portion of the second dielectric layer.

8. The method of claim 1, after the step of forming the second circuit layer and before the step of removing the substrate, further comprising:
    forming a solder mask layer on the first dielectric layer.

* * * * *